United States Patent
Actis et al.

(10) Patent No.: US 8,989,683 B2
(45) Date of Patent: Mar. 24, 2015

(54) ULTRA-WIDEBAND HIGH POWER AMPLIFIER ARCHITECTURE

(71) Applicant: BAE Systems Information And Electronic Systems Integration Inc., Nashua, NH (US)

(72) Inventors: Robert Actis, Burlington, MA (US); Robert J. Lender, Jr., Pepperell, MA (US); Steven Rajkowski, East Kingston, NH (US); Bernard J. Schmanski, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/833,653

(22) Filed: Mar. 15, 2013

(65) Prior Publication Data

US 2013/0260703 A1 Oct. 3, 2013

Related U.S. Application Data

(60) Provisional application No. 61/616,077, filed on Mar. 27, 2012.

(51) Int. Cl.
*H01Q 11/12* (2006.01)
*H04B 1/04* (2006.01)
*H03G 3/30* (2006.01)
*H03F 3/24* (2006.01)
*H03F 3/60* (2006.01)

(52) U.S. Cl.
CPC .............. *H03G 3/3042* (2013.01); *H03F 3/24* (2013.01); *H03F 3/602* (2013.01)

USPC ................ 455/127.1; 455/127.3; 455/127.4

(58) Field of Classification Search
CPC ....... H03G 3/3042; H03F 3/195; H03F 3/602; H03F 1/0277; H03F 3/213
USPC ................ 455/91, 127.1–127.4, 552.1–553.1
See application file for complete search history.

(56) References Cited

U.S. PATENT DOCUMENTS

| | | | | |
|---|---|---|---|---|
| 5,654,669 | A | * | 8/1997 | Uhling et al. .................. 330/51 |
| 5,832,373 | A | * | 11/1998 | Nakanishi et al. ............. 455/126 |
| 6,131,022 | A | * | 10/2000 | Jacomb-Hood et al. ... 455/276.1 |
| 6,661,290 | B2 | * | 12/2003 | Sugiura ......................... 330/289 |
| 6,954,623 | B2 | * | 10/2005 | Chang et al. ............... 455/127.1 |

(Continued)

*Primary Examiner* — Simon Nguyen
(74) *Attorney, Agent, or Firm* — Finch & Maloney PLLC; Daniel J. Long

(57) ABSTRACT

Techniques and architecture are disclosed for providing an ultra-wideband, multi-channel solid-state power amplifier architecture. In some embodiments, the architecture includes a power divider which splits an input signal and delivers that split signal to a plurality of downstream channel chipsets. Each channel chipset is configured to amplify a sub-band of the original full-band input signal and to provide the resultant amplified sub-band for downstream use, such as for transmission by an antenna operatively coupled with that channel. In the aggregate, the amplified sub-bands provide coverage of the same ultra-wideband frequency range of the original input signal, in some cases. In some embodiments, the architecture provides high radio frequency (RF) power with good amplifying efficiency and ultra-wide instantaneous frequency bandwidth performance in a small-form-factor package. In some instances, control circuitry is provided to control which chipset die(s) are enabled/disabled, thus providing control over gain and power levels of the output signal(s).

21 Claims, 7 Drawing Sheets

(56) References Cited

U.S. PATENT DOCUMENTS

| | | | |
|---|---|---|---|
| 7,271,658 B2* | 9/2007 | Matsushita et al. | 330/289 |
| 7,313,416 B1* | 12/2007 | Harmon et al. | 455/562.1 |
| 7,570,111 B1* | 8/2009 | Vagher et al. | 330/126 |
| 7,656,233 B2* | 2/2010 | Lee | 330/289 |
| 7,994,862 B1* | 8/2011 | Pukhovski | 330/289 |
| 8,339,204 B2* | 12/2012 | Shimizu et al. | 330/307 |
| 8,447,249 B1* | 5/2013 | Lu et al. | 455/127.2 |
| 2004/0113698 A1* | 6/2004 | Kim et al. | 330/295 |
| 2004/0145418 A1* | 7/2004 | Buer et al. | 330/307 |
| 2004/0150473 A1* | 8/2004 | Hollingsworth et al. | 330/124 R |
| 2004/0192233 A1* | 9/2004 | Mitzlaff | 455/127.1 |
| 2004/0235438 A1* | 11/2004 | Quilisch et al. | 455/127.2 |
| 2005/0168281 A1* | 8/2005 | Nagamori et al. | 330/133 |
| 2006/0006949 A1* | 1/2006 | Burns et al. | 330/301 |
| 2006/0030274 A1* | 2/2006 | Kappes et al. | 455/73 |
| 2007/0066250 A1* | 3/2007 | Takahashi et al. | 455/127.1 |
| 2008/0125061 A1* | 5/2008 | Kuriyama et al. | 455/127.1 |
| 2008/0285681 A1* | 11/2008 | Sorrells et al. | 375/297 |
| 2010/0061279 A1* | 3/2010 | Knudsen et al. | 370/278 |
| 2010/0176880 A2* | 7/2010 | Dupuy et al. | 330/124 R |
| 2010/0225401 A1* | 9/2010 | Hayata et al. | 330/295 |
| 2011/0222443 A1* | 9/2011 | Khlat | 370/277 |
| 2012/0021697 A1* | 1/2012 | Yang | 455/73 |
| 2012/0049952 A1* | 3/2012 | Ng | 330/126 |
| 2012/0081182 A1* | 4/2012 | Lender et al. | 330/286 |
| 2013/0243048 A1* | 9/2013 | ZHU et al. | 375/219 |
| 2013/0314162 A1* | 11/2013 | Schmidt | 330/295 |

* cited by examiner

ULTRA-WIDEBAND HIGH POWER AMPLIFIER ARCHITECTURE

CROSS-REFERENCE TO RELATED APPLICATIONS

This Application claims the benefit of U.S. Provisional Patent Application No. 61/616,077, filed on Mar. 27, 2012, which is herein incorporated by reference in its entirety.

STATEMENT OF GOVERNMENT INTEREST

This invention was made with United States Government support. The United States Government has certain rights in this invention.

FIELD OF THE DISCLOSURE

The disclosure relates to solid-state amplifiers and more particularly to high power amplifiers.

BACKGROUND

High power amplifier systems involve a number of non-trivial challenges, and such systems have faced particular complications, such as those with respect to increasing output power levels while reducing device size, weight, and power (SWaP). Continued device scaling will tend to exacerbate such problems.

SUMMARY

One example embodiment of the present invention provides an amplifier circuit including: a power divider configured to receive a radio frequency (RF) input signal; a first chipset operatively coupled with the power divider and configured to amplify a first sub-band of the input signal; and a second chipset operatively coupled with the power divider and configured to amplify a second sub-band of the input signal; wherein the input signal is of a given bandwidth, and sub-bands amplified by the amplifier circuit including the first sub-band and the second sub-band, in the aggregate, cover the bandwidth of the input signal. In some cases, the power divider comprises a passive power divider which provides an approximately 50%/50% power split of the input signal to the first chipset and the second chipset. In some instances, the power divider comprises a passive power divider which provides an approximately even power split of the input signal to each sub-band. In some cases, the power divider comprises an active power divider configured to at least one of evenly split the input signal and/or provide gain to the input signal. In some instances, the amplifier circuit further includes one or more additional chipsets, each coupled with the power divider and configured to amplify a different sub-band of the input signal. In some cases, the bandwidth of the input signal is about 70:1 or lower. In some other cases, the bandwidth of the input signal is about 18:1 or lower. In some instances, at least one of the first chipset and/or the second chipset includes a gallium-nitride (GaN)-based monolithic microwave integrated circuit (MMIC). In some cases, the amplifier circuit further includes a control circuit to control chipset output. In some such cases, the control circuit comprises a temperature sensing circuit configured to detect a temperature change and to shift a voltage supplied to at least one of the first chipset and/or the second chipset based on the detected temperature change. In some such instances, the voltage shift is about 0.3 V. In some cases, the control circuit comprises a switching circuit which provides a command signal that is used to electronically switch ON or OFF at least a portion of the first chipset and/or the second chipset. In some such instances, the switching circuit includes a complementary metal-oxide-semiconductor (CMOS) single-pole, double-throw (SPDT) switch, and the command signal adjusts gate bias of at least a portion of the first chipset and/or the second chipset. In some cases, the amplifier circuit further includes: a first antenna operatively coupled with the first chipset; and a second antenna operatively coupled with the second chipset.

Another example embodiment of the present invention provides an amplifier circuit including: a power divider configured to receive a radio frequency (RF) input signal; a first chipset operatively coupled with the power divider and configured to amplify a first sub-band of the input signal, the first chipset comprising: a first pre-driver; a first driver operatively coupled with the first pre-driver; and a first high power amplifier operatively coupled with the first driver; and a second chipset operatively coupled with the power divider and configured to amplify a second sub-band of the input signal, the second chipset comprising: a second pre-driver; a second driver operatively coupled with the second pre-driver; and a second high power amplifier operatively coupled with the second driver; wherein at least one of the first pre-driver, the first driver, the first high power amplifier, the second pre-driver, the second driver, and/or the second high power amplifier comprises a gallium-nitride (GaN)-based monolithic microwave integrated circuit (MMIC). In some cases, the amplifier circuit further includes an off-chip matching circuit operatively coupled with the first high power amplifier of the first chipset. In some instances, the first chipset and the second chipset serve to partition a full, instantaneous operating bandwidth of the input signal. In some cases, the amplifier circuit further includes a control circuit comprising: a temperature sensing circuit configured to detect a temperature change and to shift a voltage supplied to at least one of the first chipset and/or the second chipset based on the detected temperature change, wherein the voltage shift serves to offset amplifier circuit performance over a temperature range; and a switching circuit configured to provide a command signal which is used to electronically switch ON or OFF at least one of the first pre-driver, the first driver, the first high power amplifier, the second pre-driver, the second driver, and/or the second high power amplifier.

Another example embodiment of the present invention provides a transmitter including: a passive, in-phase power divider configured to receive an input signal having a bandwidth of at least 18:1; a first channel chipset operatively coupled with the passive power divider and configured to amplify a first sub-band of the input signal; a second channel chipset operatively coupled with the passive power divider and configured to amplify a second sub-band of the input signal; a first antenna operatively coupled with the first channel chipset and configured to transmit the first sub-band after amplification thereof by the first channel chipset; and a second antenna operatively coupled with the second channel chipset and configured to transmit the second sub-band after amplification thereof by the second channel chipset. In some cases, the transmitter further includes a control circuit comprising at least one of: a temperature sensing circuit configured to detect a temperature change and to shift a voltage supplied to at least one of the first channel chipset and/or the second channel chipset based on the detected temperature change; and/or a switching circuit configured to provide a command signal which is used to electronically switch ON or OFF at least a portion of the first channel chipset and/or the second channel chipset. In some cases, the transmitter further includes a control circuit configured to reduce output power and gain levels of at least one of the first channel chipset and/or the second channel chipset and to maintain frequency bandwidth response at those reduced output power and gain levels.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

DETAILED DESCRIPTION

Figure 1A:
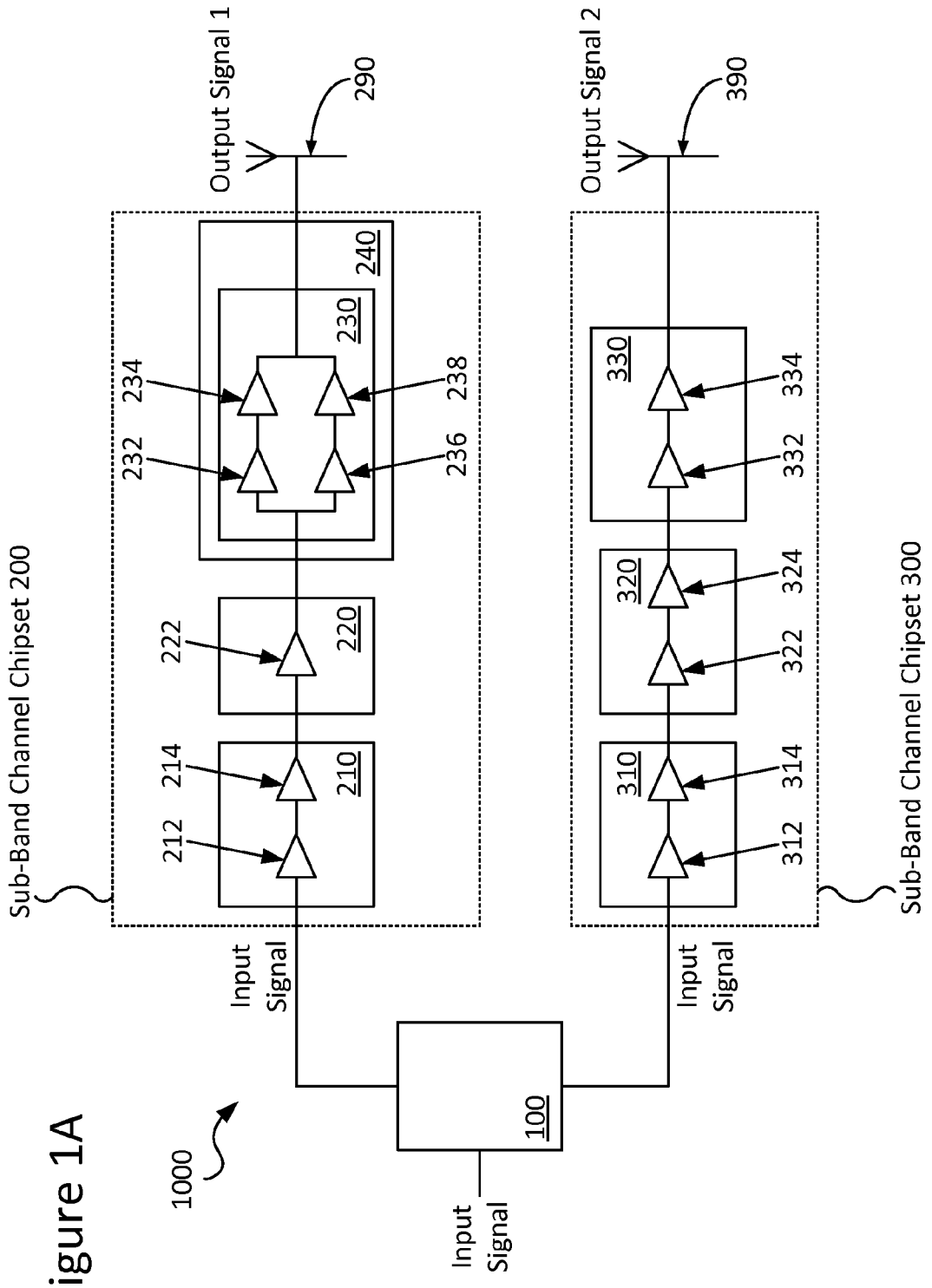
FIG. 1A is a schematic view of an amplifier architecture configured in accordance with an embodiment of the present invention.

Techniques and architecture are disclosed for providing an ultra-wideband, multi-channel solid-state power amplifier architecture. In some embodiments, the architecture includes a power divider which splits an input signal and delivers that split signal to a plurality of downstream channel chipsets. Each channel chipset is configured to amplify a sub-band of the original full-band input signal and to provide the resultant amplified sub-band for downstream use, such as for transmission by an antenna operatively coupled with that channel. In the aggregate, the amplified sub-bands provide coverage of the same ultra-wideband frequency range of the original input signal, in accordance with some embodiments. In some such embodiments, the architecture provides high radio frequency (RF) power with good amplifying efficiency and ultra-wide instantaneous frequency bandwidth performance in a small-form-factor package. In some instances, control circuitry is provided to control which semiconductor die(s) of a given channel chipset are enabled/disabled, thus providing control over the gain and power levels of the output signal(s). Numerous configurations and variations will be apparent in light of this disclosure.

General Overview

As previously indicated, there are a number of non-trivial issues that can arise which can complicate high power amplifier systems. For instance, one non-trivial issue pertains to the fact that there continues to be a need to develop transmitters that provide high levels of radio frequency (RF) power over increasingly wider frequency bandwidths using architectures that exploit reduced size, weight, and power (SWaP). One existing approach to addressing reduced-SWaP high power amplifiers involves making use of gallium-nitride (GaN) solid-state semiconductors. To date, power amplifiers employing GaN have demonstrated RF power comparable to larger size travelling-wave-tube amplifiers (TWTAs) and have increased power amplifier reliability and maintainability over TWTA technology. However, the ability to provide high RF power over increased operating bandwidth is significantly impeded due to factors including the high circuit losses associated with the wideband matching networks required in such amplifiers.

Thus, and in accordance with an embodiment of the present invention, techniques are disclosed for providing an ultra-wideband, multi-channel solid-state power amplifier architecture. At its input, the disclosed amplifier architecture utilizes a power divider which splits a received input signal and delivers that split signal to a plurality of downstream channel chipsets. Each such channel chipset is configured to amplify a narrower frequency sub-band (channel) of the input signal which it receives. Thus, in a sense, the channel chipsets serve to partition the full, instantaneous operating bandwidth of the original input signal. In some cases, wide-frequency, high-power channel chipsets, such as gallium-nitride (GaN) monolithic microwave integrated circuits (MMICs), can be used. In any case, the resultant amplified sub-bands can be delivered downstream, for example, for subsequent transmission by antennas associated with the channel chipsets.

In some instances, the channel chipsets can be optimized or otherwise tailored to amplify a given sub-band of the input signal, which may result in more efficient sub-band performance. Also, use of such band-limited chipsets for each channel of the power amplifier architecture can provide, in accordance with an embodiment, an inherent frequency discriminator which may aid in determining which sub-band signal is to be amplified and ultimately transmitted. Furthermore, and in accordance with an embodiment, the use of multiple wideband chipsets in conjunction with the power splitting at the input of the amplifier architecture where power levels are relatively low allows for use of ultra-wideband, low-level input signals (and thus a low-loss, ultra-wideband, in-phase power divider, in some instances).

In a power amplifier architecture configured as described herein, each sub-band signal is amplified only in one of the channels having the appropriate band-limited amplifying channel bandwidth. Collectively, however, and in accordance with one such embodiment, the channels of the amplifier architecture provide amplification over a much wider total instantaneous bandwidth than would be possible with any of the individual channel sub-bands alone. Also, because each channel amplifies only a portion of the overall instantaneous power amplifier bandwidth, high RF power with good amplifying efficiency can be achieved in each channel sub-band.

In accordance with one or more embodiments of the present invention, the combination of distributed wideband channel chipsets (e.g., GaN MMICs) and bandwidth partitioning may overcome the inherent weakness in band-limited MMIC chipsets and antenna element bandwidth to achieve a combination of high RF power, ultra-wideband instantaneous frequency bandwidth performance, and reduced package form-factor beyond what is obtainable using existing techniques and architectures. Some embodiments may provide a combination of RF power and bandwidth performance, for example, which exceeds the performance obtainable with existing amplifier approaches, including TWTAs. In one specific example embodiment, a dual-band power amplifier architecture having an operating bandwidth in excess of 18:1 can be provided using the disclosed techniques and architecture. Numerous configurations will be apparent in light of this disclosure.

For instance, in some cases, the disclosed techniques can be used to provide an ultra-wideband high power amplifier which exhibits a significantly extended overall amplifier bandwidth as compared to existing architectures. For example, some embodiments can be used to amplify input signals having a frequency in the range of about 0.1-18 GHz with minimal or otherwise negligible loss. The claimed invention is not so limited however, as some other embodiments can be used to amplify input signals of greater frequency (e.g., in the range of about 18-40 GHz, about 40-60 GHz, or greater, depending on the target application) with minimal or otherwise negligible loss. Coverage of other frequency ranges or sub-sets of any frequency range may be provided, for example, by adjusting the number of channels utilized in a given power amplifier configured as described herein. Numerous configurations will be apparent in light of this disclosure.

As previously noted, and in accordance with one or more embodiments, the disclosed techniques and architecture can be used to provide a power amplifier which exhibits both high RF power and ultra-wide instantaneous frequency bandwidth performance in a small-form-factor transmitter package. In some instances, these resultant reduced-SWaP transmitter architectures may find application, for example, in electronic warfare (EW) systems. Other suitable uses and contexts will be apparent in light of this disclosure.

Also, and in accordance with an embodiment, use of the disclosed techniques and architecture may avoid or otherwise reduce complications related to the use of antennas which are inherently band-limited. For example, by dividing up the input signal into multiple channels, each downstream band-limited antenna may receive an appropriately band-limited output signal, thereby eliminating or otherwise mitigating bandwidth complications which otherwise might arise from utilizing an undivided input signal.

Furthermore, a multi-channel power amplifier architecture configured as described herein can omit use of a physical microwave switch at the beginning of such architecture. Instead, and in accordance with one such embodiment, the amplifier architecture can control the ON and OFF states (and thus the selection) of a given channel thereof, for example, utilizing an electronic switch which makes use of the active gate bias control of the semiconductor devices in a particular channel of the amplifier architecture. The channel(s) of the multi-channel power amplifier architecture which are not within the signal bandwidth (e.g., which do not contain the signal of interest) can be placed in an OFF state with no detrimental effect on the operating channel, which remains in an ON state. As a result, a reduction in the DC power requirements of the amplifier architecture (and any system implementing such architecture) may be realized. This may be aided, for example, by fast turn-ON and turn-OFF capabilities of the semiconductor devices of the disclosed power amplifier architecture, knowledge of the input frequency signal, and/or use of suitable DC control for each channel.

System Architecture and Operation

Figure 1B:
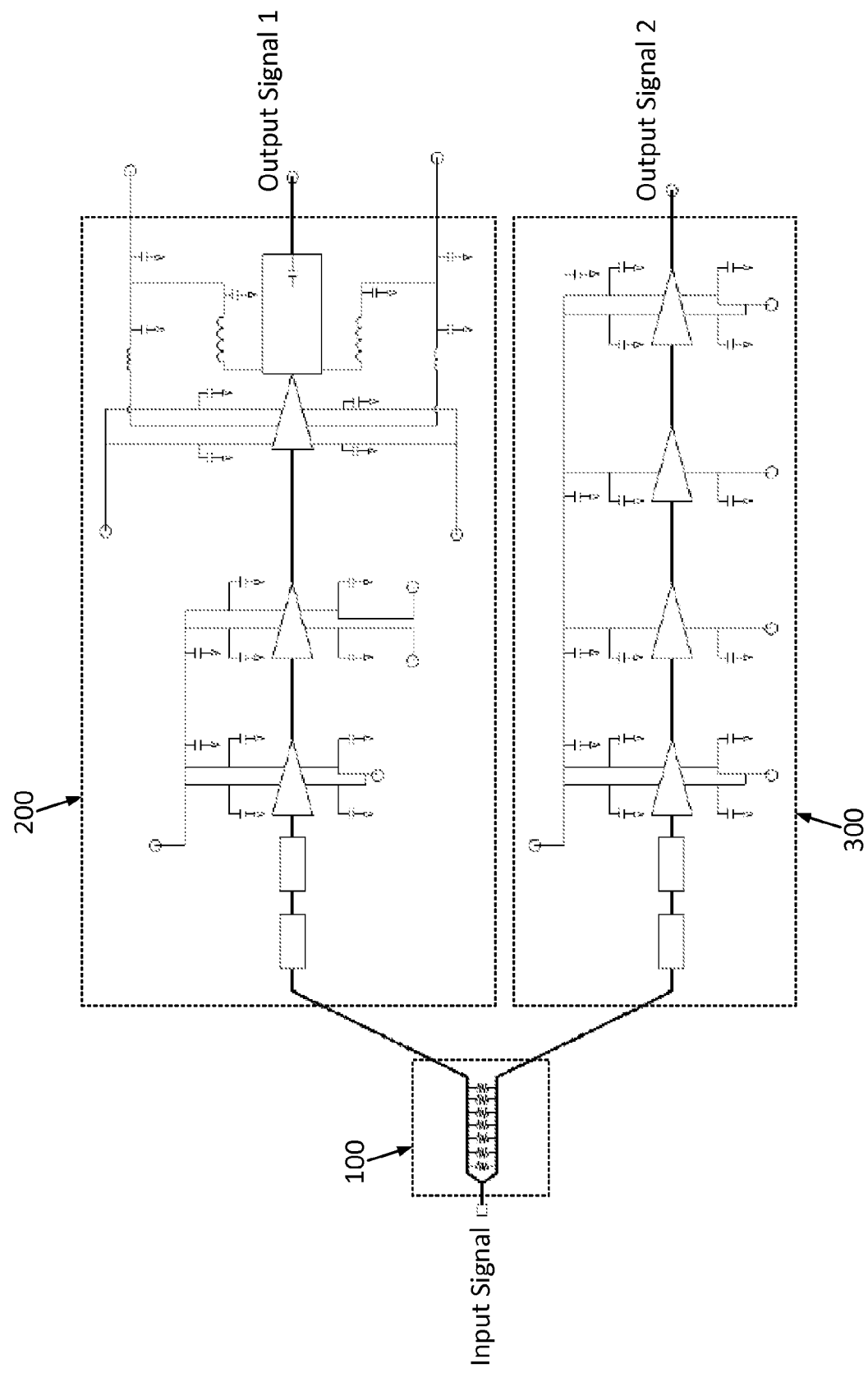
FIG. 1B is a circuit schematic of the amplifier architecture of FIG. 1A.
Figure 2:
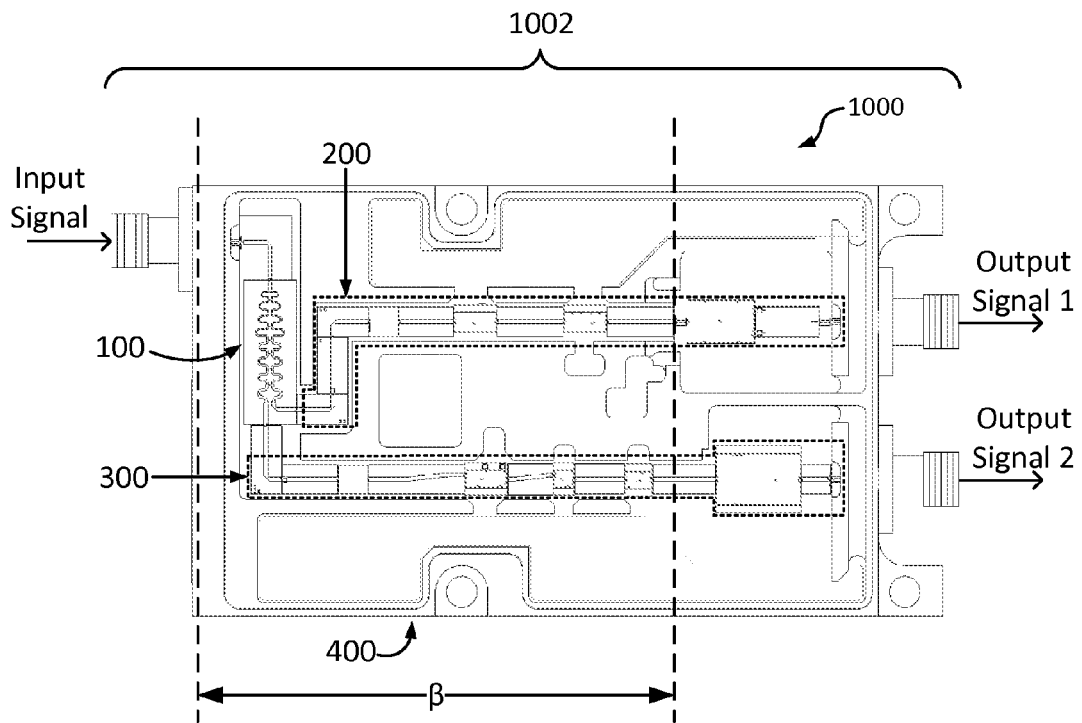
FIG. 2 is a top-down view of a module including an amplifier architecture configured in accordance with an embodiment of the present invention.

FIG. 1A is a schematic view of an amplifier architecture 1000 configured in accordance with an embodiment of the present invention, and FIG. 1B is a circuit schematic of the architecture 1000 of FIG. 1A. FIG. 2 is a top-down view of a module 1002 including an amplifier architecture 1000 configured in accordance with an embodiment of the present invention. As can be seen, architecture 1000 includes: a divider 100; a first sub-band channel chipset 200 coupled with a first output of divider 100; and a second sub-band channel chipset 300 coupled with a second output of divider 100. In accordance with an embodiment, architecture 1000 can receive an Input Signal, for example, at divider 100, which splits that signal and provides it equally downstream to channel chipsets 200 and 300. Each of channel chipsets 200 and 300 is configured to amplify a given frequency sub-band of the full bandwidth of the Input Signal. Thus, in a more general sense, architecture 1000 is configured to divide the full instantaneous frequency bandwidth of an Input Signal received thereby into narrower frequency sub-bands (channels) which are amplified separately from one another, and those amplified sub-bands (Output Signals 1 and 2, respectively) are then available for downstream use (e.g., such as for transmission by antenna elements 290 and 390 coupled with chipsets 200 and 300, respectively).

It should be noted that the claimed invention is not intended to be limited to the example embodiment of FIGS. 1A-1B. For instance, while the example architecture 1000 depicted in FIGS. 1A-1B includes only a first sub-band channel chipset 200 and a second sub-band channel chipset 300 which provide Output Signals 1 and 2, respectively, other embodiments of the present invention may include additional chipsets (e.g., three, four, five or more sub-band channel chipsets), which can provide additional output signals (e.g., three, four, five, or more output signals), as desired for a given target application or end-use. Numerous suitable configurations will be apparent in light of this disclosure.

Architecture 1000 can provide output signals (e.g., Output Signals 1 and 2) of any of a wide range of frequencies, and thus architecture 1000 can exhibit ultra-wideband amplification performance, in accordance with some embodiments. For instance, in some cases, architecture 1000 can provide an output bandwidth that is less than or equal to about 10:1 (e.g., about 8:1, about 5:1, about 3:1, about 2:1, about 1:1). However, the claimed invention is not so limited. In some other embodiments, architecture 1000 can provide an output bandwidth in the range of about 10:1 to about 30:1 (e.g., about 15:1, about 20:1, about 25:1). In some still other embodiments, architecture 1000 can provide an output bandwidth that is greater than or equal to about 30:1 (e.g., about 40:1, about 50:1, about 60:1, about 70:1, or greater). In a more general sense, architecture 1000 can be configured to provide any number of output signals of any given bandwidth, as desired for a given target application or end-use.

In some cases, and in accordance with an embodiment, architecture 1000 may be configured to allow use of an Input Signal, for example, which is a low-level, ultra-wideband radio frequency (RF) signal. As will be appreciated in light of this disclosure, the frequency range of the Input Signal may be varied as desired for a given target application or end-use. Furthermore, as discussed below, and in accordance with an embodiment, architecture 1000 may be configured to alter its performance based on one or more characteristics of the Input Signal and/or the Output Signal(s) derived therefrom (e.g., frequency sub-bands of interest, output power levels).

As can be seen from FIGS. 1A-1B and FIG. 2, a divider 100 can be included, for example, at the input of architecture

1000. In accordance with an embodiment, divider 100 is configured to receive an Input Signal and to split that signal for downstream use in architecture 1000. In some embodiments, divider 100 can be configured as a two-channel (2:1) splitter which splits the Input Signal into two signals, one of which is sent to channel chipset 200 and the other of which is sent to channel chipset 300, both of which are discussed in detail below. In such a case, about 50% of the power of the Input Signal is delivered to channel chipset 200 while the balance is delivered to channel chipset 300 (e.g., about a 50%/50% power split is provided by divider 100). The claimed invention is not so limited, however. In other embodiments, divider 100 can be configured, for example, to split the Input Signal into three, four, five, or more channels, as desired for a given target application or end-use. As will be appreciated in light of this disclosure, additional chipsets accordingly may be implemented for the additional signal channels, when provided. In a more general sense, power divider 100 can be configured to split a given Input Signal for delivery to any number of channels of a given multi-channel amplifier architecture 1000.

Divider 100 can have any of a wide variety of configurations. For example, consider FIG. 3A, which is a perspective view of a passive divider 100a configured in accordance with an embodiment of the present invention. As can be seen in the depicted example embodiment, divider 100a is configured here as a two-channel (2:1) passive power divider which provides an approximately 50%/50% power split of the Input Signal. In this configuration, the Input Signal is received at port 101a of divider 100a, and the signal propagates along divider 100a in the general direction indicated by the large, bolded arrow in the figure. A first instance of the Input Signal exits divider 100a at port 102a (e.g., to be received by channel chipset 200), while a second instance of the Input Signal exits at port 103a (e.g., to be received by channel chipset 300). In one example instance, divider 100a can be an ultra-wideband, in-phase passive divider which provides low-loss power division. Other suitable configurations for passive divider 100a will depend on a given application and will be apparent in light of this disclosure.

Figure 3A:
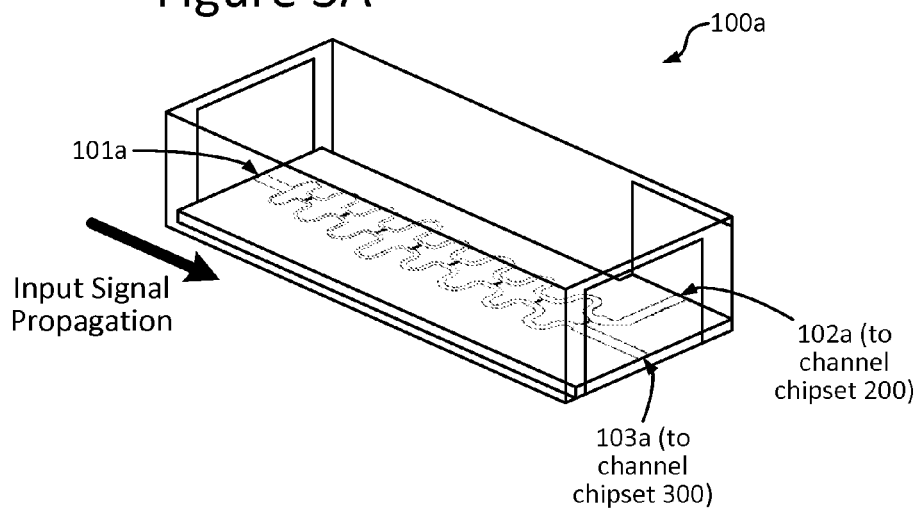
FIG. 3A is a perspective view of a passive divider configured in accordance with an embodiment of the present invention.
Figure 3B:
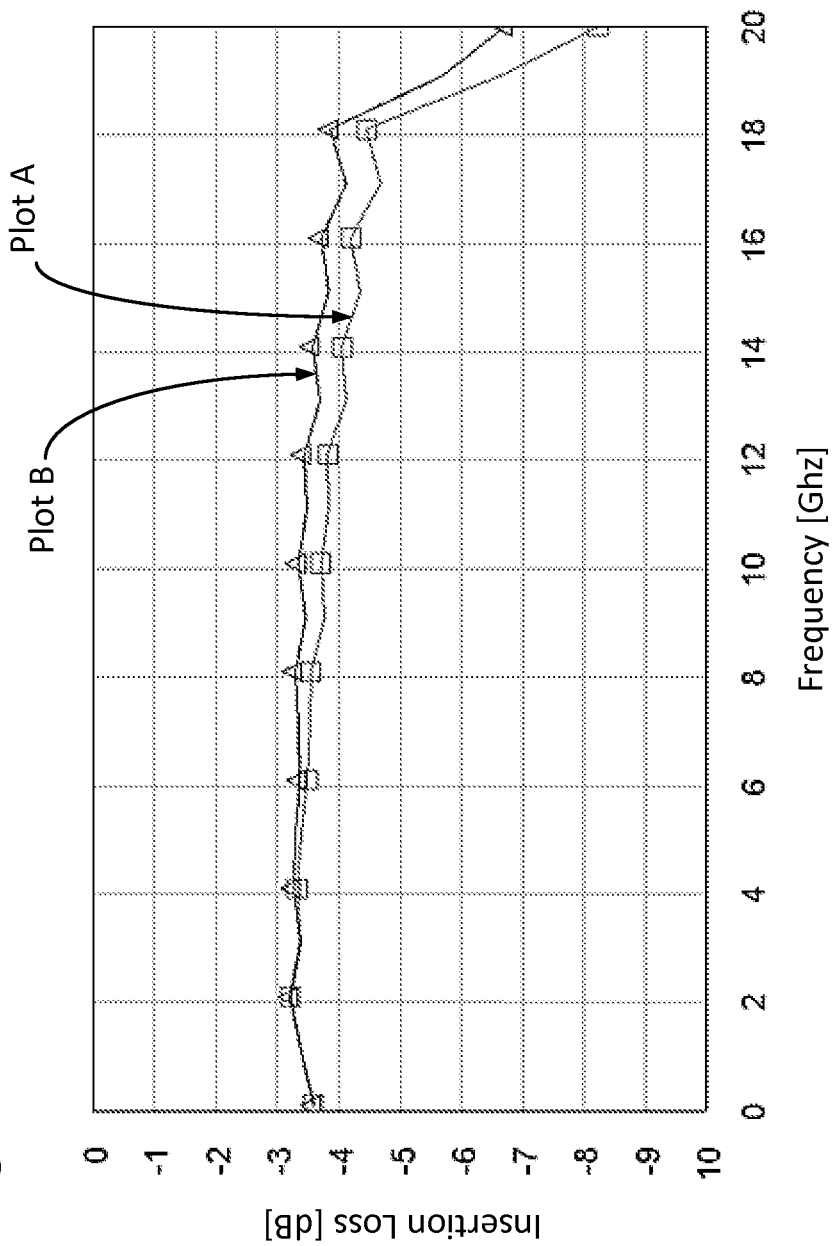
FIG. 3B illustrates simulated insertion loss performance for the passive divider of FIG. 3A, in accordance with an embodiment of the present invention.

FIG. 3B illustrates simulated insertion loss performance for the passive divider 100a of FIG. 3A, in accordance with an embodiment of the present invention. The line labeled 'Plot A' represents the insertion loss of the Input Signal from port 101a to port 102a (e.g., directed to channel chipset 200) of the divider 100a, while the line labeled 'Plot B' represents the insertion loss of the Input Signal from port 101a to port 103a (e.g., directed to channel chipset 300) of the divider 100a. Within the context of FIG. 3B, divider 100a is configured as an 18:1 full-band divider which receives an Input Signal having a bandwidth in excess of 18:1 (e.g., in the range of about 1-18 GHz). As will be appreciated in light of this disclosure, for a 2:1 passive power divider which provides a 50%/50% power split, about a 3 dB loss for each arm of that divider typically may be observed. Thus, as Plots A and B generally show an approximately 3.5 dB loss over a frequency range of about 18 GHz, it follows then that about a 0.5 dB insertion loss results from use of passive divider 100a in architecture 1000, in accordance with an embodiment. Furthermore, Plots A and B of FIG. 3B effectively show that divider 100a provides this low-loss performance in such a manner where any observed loss is substantially flat over the full band of the Input Signal (e.g., over the approximately 18 GHz range in this example case).

It should be noted, however, that the claimed invention is not intended to be limited only to use of passive dividers for divider 100 of architecture 1000. For example, consider FIG. 4A, which is a layout view of an active divider 100b configured in accordance with an embodiment of the present invention. As can be seen in the depicted example embodiment, divider 100b is configured here as a two-channel (2:1) active divider which provides an approximately 50%/50% power split of the Input Signal while also providing gain thereto. In one example instance, divider 100b can be an ultra-wideband, active divider which provides gain in addition to power division. In the depicted example configuration, the Input Signal is received at port 101b of divider 100b, and the signal propagates along divider 100b in the general direction indicated by the large, bolded arrow in the figure. A first instance of the Input Signal exits divider 100b at port 102b to be received by a channel chipset 200' which is configured, for example, to amplify a sub-band in the range of about 0.1-1.5 GHz. A second instance of the Input Signal exits at port 103b to be received by a channel chipset 300' which is configured, for example, to amplify a sub-band in the range of about 1.5-7 GHz. The claimed invention is not so limited, however. For instance, the operating bandwidths of channel chipsets 200' and/or 300' may be varied as desired for a given target application or end-use, in accordance with one or more other embodiments. Numerous configurations will be apparent in light of this disclosure.

Figure 4A:
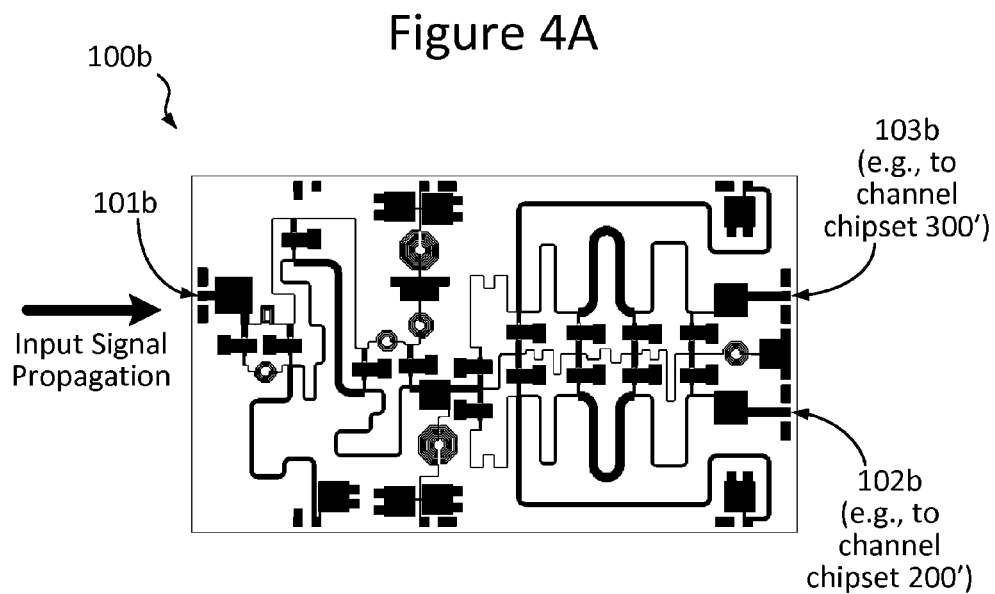
FIG. 4A is a layout view of an active divider configured in accordance with an embodiment of the present invention.
Figure 4B:
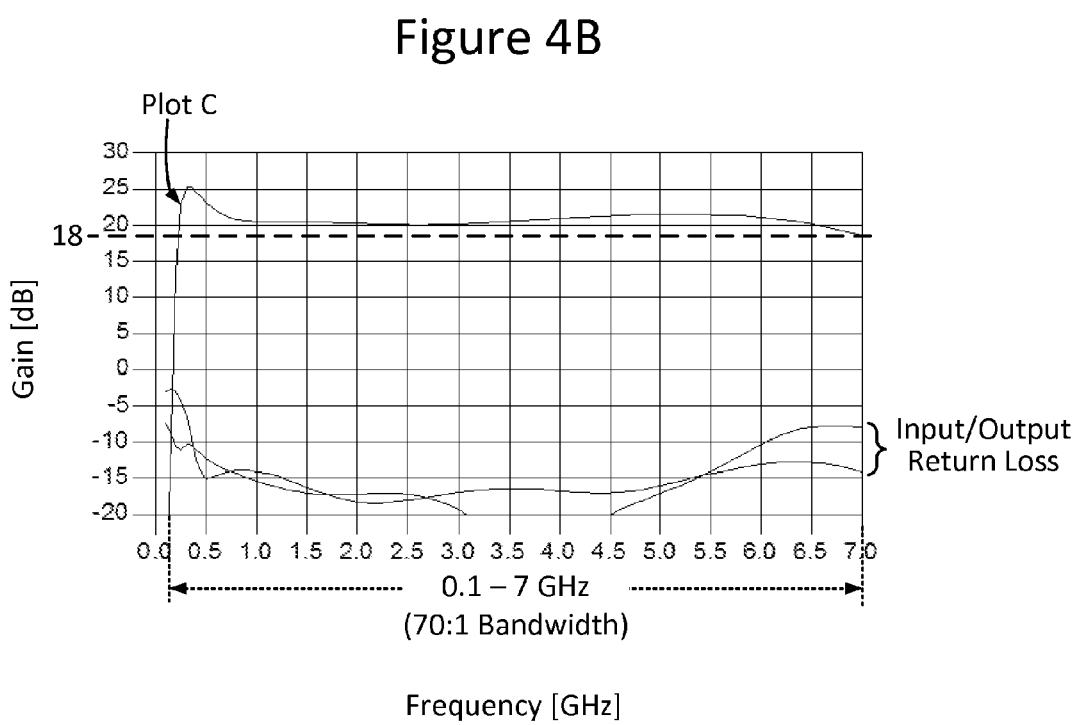
FIG. 4B illustrates simulated gain performance for the active divider of FIG. 4A, in accordance with an embodiment of the present invention.

FIG. 4B illustrates simulated gain performance for the active divider 100b of FIG. 4A, in accordance with an embodiment of the present invention. The line labeled 'Plot C' represents the gain provided as a function of frequency for the Input Signal from port 101b to port 102b/port 103b of divider 100b. Within the context of FIG. 4B, divider 100b is configured as a 70:1 full-band divider which receives an Input Signal having a bandwidth in excess of 70:1 (e.g., in the range of about 0.1-7 GHz). As can be seen, divider 100b can provide gain, for example, in excess of about 18 dB over the approximately 70:1 bandwidth.

In any case, inclusion of divider 100 (e.g., divider 100a, divider 100b) at the input of architecture 1000 (e.g., where power levels are relatively low) may allow for use, for example, of a low-level, ultra-wideband Input Signal, which in turn may allow for obtaining ultra-wideband performance from architecture 1000 while maintaining low-loss power splitting. Other suitable configurations for divider 100 will depend on a given application and will be apparent in light of this disclosure.

Returning now to FIGS. 1A-1B, architecture 1000 includes a plurality of channel chipsets downstream of divider 100 which receive the Input Signal after splitting thereof by divider 100. In accordance with an embodiment, chipsets 200 and 300 (and any additional chipsets optionally implemented for additional channels of amplifier architecture 1000) each can be configured to operate over a given narrower frequency sub-band (channel) within the full instantaneous frequency of the Input Signal received by architecture 1000. Thus, in a sense, channel chipsets 200 and 300 (and any other channel chipsets, if provided) serve to partition the full operating bandwidth for amplifier architecture 1000, in accordance with an embodiment. The inherent bandwidth-limited nature of channel chipsets 200 and 300 (and any other channel chipsets which may be included optionally) determines which sub-bands of the full-bandwidth Input Signal are amplified and which frequency ranges are allowed to fall away unamplified, and thus which output signals ultimately are available for downstream use (e.g., for transmission by one or more downstream antennas 290/390).

As discussed below, and in accordance with one or more embodiments, each channel chipset 200/300 (and others, if provided) can include wideband circuit architecture(s) which are tailored or otherwise configured, for example, to operate on (e.g., to amplify) their respective sub-bands of interest of the original Input Signal while providing the lowest possible loss in each sub-band. Furthermore, and in accordance with an embodiment, a given channel chipset 200/300 (or other) can be configured based on the inherent bandwidth limitations, for example, of whichever downstream antenna 290/390 will receive and ultimately transmit that channel's amplified sub-band signal. Thus, by virtue of the configurations of its channel chipsets 200 and 300 (and any others optionally implemented), architecture 1000 may exhibit more efficient sub-band performance, which in turn may improve the overall efficiency of an amplifier system utilizing architecture 1000. A description of channel chipsets 200 and 300 of the architecture 1000 now follows.

As previously noted, after being split by divider 100, the Input Signal is provided to a first sub-band channel chipset 200. Also, as previously noted, and in accordance with an embodiment, chipset 200 is generally configured to amplify a first sub-band of interest of the Input Signal and to provide the resultant amplified signal (e.g., Output Signal 1) for downstream use (e.g., transmission by a first antenna 290). To that end, and in accordance with an embodiment, channel chipset 200 can be configured to provide band-limited amplification, and in some instances may be inherently band-limited, for example, by virtue of its componentry. In one example embodiment, chipset 200 is limited to amplifying signal frequencies in the range of about 1-4 GHz. However, the claimed invention is not so limited, as other frequency ranges (e.g., less than about 1 GHz; greater than about 4 GHz) for channel chipset 200 can be provided as desired for a given target application or end-use, in accordance with other embodiments. For example, as previously discussed, a channel chipset 200' configured to amplify signal frequencies in the range of about 0.1-1.5 GHz can be provided, in accordance with some embodiments. In any such case, Output Signal 1 effectively can be limited to that same frequency range; that is, if chipset 200 is configured, for example, to amplify signal frequencies in the 1-4 GHz range, then signal frequencies outside of that range may be allowed to fall away unamplified, and Output Signal 1 may exhibit one or more frequencies within that range (e.g., representing the first sub-band of interest).

In the depicted example embodiment of FIGS. 1A-1B, channel chipset 200 includes: a pre-driver 210; a driver 220 operatively coupled with the output of pre-driver 210; and a high power amplifier (HPA) 230 operatively coupled with the output of driver 220. Each of pre-driver 210, driver 220, and HPA 230 will be discussed in turn below. In accordance with one or more embodiments, any of pre-driver 210, driver 220, and/or HPA 230 of chipset 200 can be configured, for example, as wideband monolithic microwave integrated circuits (MMICs), in some such instances utilizing gallium-nitride (GaN)-based semiconductor devices. Other suitable components, bandwidth ranges, and configurations for chipset 200 will depend on a given application and will be apparent in light of this disclosure.

In the depicted example embodiment of FIGS. 1A-1B, pre-driver 210 is configured as a two-stage pre-driver including an amplifier 212 and an amplifier 214 coupled with an output thereof. As previously noted, pre-driver 210 can be configured, in some example instances, as a GaN MMIC. In some embodiments, pre-driver 210 utilizes wideband circuit architecture for amplifier 212 and/or amplifier 214, such as is described in U.S. Pat. No. 7,924,097, issued on Apr. 12, 2011, and titled "Solid-State Ultra-Wideband Microwave Power Amplifier Employing Modular Non-Uniform Distributed Amplifier Elements," which is herein incorporated by reference in its entirety. Other suitable configurations for pre-driver 210 and its constituent amplifiers 212/214 will depend on a given application and will be apparent in light of this disclosure.

As can further be seen from FIGS. 1A-1B, driver 220 is operatively coupled with the output of pre-driver 210 (e.g., at the output of amplifier 214 thereof). In the depicted example embodiment, driver 220 is configured as a single-stage driver including an amplifier 222. As previously noted, driver 220 can be configured, in some example instances, as a GaN MMIC. Also, in some instances, driver 220 utilizes the same wideband circuit architecture for amplifier 222 as is discussed above with reference to pre-driver 210. Other suitable configurations for driver 220 and amplifier 222 will depend on a given application and will be apparent in light of this disclosure.

As can further be seen from FIGS. 1A-1B, HPA 230 is operatively coupled with the output of driver 220 (e.g., at the output of amplifier 222 thereof). In the depicted example embodiment, HPA 230 includes a first series of amplifiers 232 and 234 and a second series of amplifiers 236 and 238, where the inputs of amplifiers 232 and 236 are coupled together with the output of driver 220, and the outputs of amplifiers 234 and 238 are coupled together. As previously noted, HPA 230 can be configured, in some example instances, as a GaN MMIC. Also, in some instances, HPA 230 utilizes wideband circuit architecture for amplifiers 232, 234, 236, and/or 238, such as is described in U.S. Pat. No. 8,076,975, issued on Dec. 13, 2011, and titled "Broadband High Power Amplifier," which is herein incorporated by reference in its entirety. In some embodiments, HPA 230 can be operatively coupled with an off-chip matching circuit 240 configured to aid in combining the outbound signal of the first series of amplifiers 232/234 and the outbound signal of the second series of amplifiers 236/238 into a single output signal (e.g., Output Signal 1). Other suitable configurations for HPA 230, its constituent amplifiers 232/234/236/238, and matching circuit 240 will depend on a given application and will be apparent in light of this disclosure.

Downstream of divider 100, the Input Signal is also provided to a second sub-band channel chipset 300. As previously noted, and in accordance with an embodiment, chipset 300 is generally configured to amplify a first sub-band of interest of the Input Signal and to provide the resultant amplified signal (e.g., Output Signal 2) for downstream use (e.g., transmission by a second antenna 390). To that end, and in accordance with an embodiment, channel chipset 300 can be configured to provide band-limited amplification, and in some instances may be inherently band-limited, for example, by virtue of its componentry. In one example embodiment, chipset 300 is limited to amplifying signal frequencies in the range of about 3-18 GHz. However, the claimed invention is not so limited, as other frequency ranges (e.g., less than about 3 GHz; greater than about 18 GHz) for channel chipset 300 can be provided as desired for a given target application or end-use, in accordance with other embodiments. For example, as previously discussed, a channel chipset 300' configured to amplify signal frequencies in the range of about 1.5-7 GHz can be provided, in accordance with some embodiments. In any such case, Output Signal 2 effectively can be limited to that same frequency range; that is, if chipset 300 is configured, for example, to amplify signal frequencies in the 3-18 GHz range, then signal frequencies outside of that range may be allowed to fall away unamplified, and Output Signal 2 may exhibit one or more frequencies within that range (e.g., representing the second sub-band of interest).

In the depicted example embodiment of FIGS. 1A-1B, channel chipset 300 includes: a pre-driver 310; a driver 320 operatively coupled with the output of pre-driver 310; and a high power amplifier (HPA) 330 operatively coupled with the output of driver 320. Each of pre-driver 310, driver 320, and HPA 330 will be discussed in turn below. In accordance with one or more embodiments, any of pre-driver 310, driver 320, and/or HPA 330 of chipset 300 can be configured, for example, as wideband MMICs, in some such instances utilizing GaN-based semiconductor devices. Other suitable components, bandwidth ranges, and configurations for chipset 300 will depend on a given application and will be apparent in light of this disclosure.

In the depicted example embodiment of FIGS. 1A-1B, pre-driver 310 is configured as a two-stage pre-driver including an amplifier 312 and an amplifier 314 coupled with an output thereof. As previously noted, pre-driver 310 can be configured, in some example instances, as a GaN MMIC. In some instances, pre-driver 310 utilizes the same wideband circuit architecture for amplifier 312 and/or amplifier 314 as is discussed above with reference to pre-driver 210. Other suitable configurations for pre-driver 310 and its constituent amplifiers 312/314 will depend on a given application and will be apparent in light of this disclosure.

As can further be seen from FIGS. 1A-1B, driver 320 is operatively coupled with the output of pre-driver 310 (e.g., at the output of amplifier 314 thereof). In the depicted example embodiment, driver 320 is configured as a two-stage driver including an amplifier 322 and an amplifier 324 coupled with an output thereof. As previously noted, driver 320 can be configured, in some example instances, as a GaN MMIC. Also, in some instances, driver 320 utilizes the same wideband circuit architecture for amplifier 322 and/or amplifier 324 as is discussed above with reference to pre-driver 210. Other suitable configurations for driver 320 and its constituent amplifiers 322/324 will depend on a given application and will be apparent in light of this disclosure.

As can further be seen from FIGS. 1A-1B, HPA 330 is operatively coupled with the output of driver 320 (e.g., at the output of amplifier 324 thereof). In the depicted example embodiment, HPA 330 is configured as a two-stage HPA including an amplifier 332 and an amplifier 334 coupled with an output thereof. As previously noted, HPA 330 can be configured, in some example instances, as a GaN MMIC. Also, in some instances, HPA 330 utilizes the same wideband circuit architecture as is discussed above with reference to HPA 230. As is further evident from FIG. 1A, an off-chip matching circuit can be omitted from HPA 330 in some instances, for example, given that amplifiers 332 and 334 are coupled in series (e.g., as opposed to HPA 230 which includes a first series of amplifiers 232 and 234 and a second series of amplifiers 236 and 238 which are provided in a parallel coupling arrangement). Other suitable configurations for HPA 330 and its constituent amplifiers 332/334 will depend on a given application and will be apparent in light of this disclosure.

As previously discussed, architecture 1000 is configured to provide one or more output signals, each of which is an amplified sub-band of the original full-band Input Signal. While each output signal of architecture 1000 individually constitutes only a portion of the full instantaneous bandwidth of the original Input Signal, those output signals provide coverage, in the aggregate, of the full frequency bandwidth of the Input Signal, in accordance with some embodiments. In some such cases, the various output signals of architecture 1000—each representing a given sub-band of interest—can be summed together to provide substantially or identically the same frequency bandwidth coverage as the original Input Signal. Thus, as previously discussed, amplifier architecture 1000 can be configured to achieve ultra-wideband performance in some cases. Also, it may be desirable in some instances to ensure that the operating bandwidths of chipset 200 and chipset 300 (and/or any other channel chipsets which may be provided in architecture 1000) have some overlap in amplifying frequency range so as to provide the desired degree of coverage for a given target application or end-use.

In some cases, architecture 1000 may include control circuitry to aid in controlling the one or more output signals produced thereby. For instance, consider FIG. 5, which is a circuit schematic of a control circuit 400 configured in accordance with an embodiment of the present invention. As can be seen, control circuit 400 includes: a temperature sensing circuit 410; and a switching circuit 420 operatively coupled with circuit 410. In some instances, control circuit 400 may be configured as an active gate bias circuit which controls the input received by the gate of any given semiconductor die of architecture 1000 (e.g., pre-driver 210, driver 220, and/or HPA 230 of sub-band channel chipset 200; pre-driver 310, driver 320, and/or HPA 330 of sub-band channel chipset 300). Temperature sensing circuit 410 and switching circuit 420 are discussed below in turn. Other suitable configurations for control circuit 400 will depend on a given application and will be apparent in light of this disclosure.

By virtue of its inclusion of temperature sensing circuit 410, control circuit 400 can serve, in accordance with an embodiment, to improve the output power of the circuit dies (e.g., GaN MMICs discussed above) of architecture 1000 at higher temperatures and to decrease power consumption of those circuit dies at colder temperatures. To that end, circuit 410 can be configured to shift the voltage based on observed temperature changes to offset MMIC performance over a given temperature range. This functionality can be achieved, for instance, by adding the sense voltage generated by a temperature sensor (e.g., such as the LM335A active precision temperature sensor produced by Texas Instruments, Inc., or other suitable temperature sensor, as will be apparent in light of this disclosure) to the gate voltage of a given circuit die of architecture 1000. As the temperature increases, the positive voltage from the temperature sensor also increases. This voltage is added to the GaN MMIC gate voltage, which is negative, reducing the overall negative voltage. This new gate bias helps to offset the loss of current and output power experienced at higher temperatures by the GaN devices, which may be a desirable functionality, for example, in real-world power amplifiers embedded in transmitters. At colder temperatures, the opposite effect occurs—the positive voltage generated by the temperature sensor decreases. When added to the GaN MMIC gate voltage, which is negative, it increases the overall negative voltage. This new gate bias lowers the DC current (and correspondingly lowers DC power consumption) and reduces the output power increase experienced at lower temperatures. In one specific example embodiment, about a 0.3 V change (e.g., ±10%) is provided if the ambient temperature is warmer than desired, and about a 0.3 V change (e.g., ±10%) is provided if the ambient temperature is cooler than desired. Other suitable configurations and voltage shifts will depend on a given application and will be apparent in light of this disclosure.

In some instances, it may be desirable to provide amplifier architecture 1000 with the ability to shut off a given portion of channel chipset 200 and/or 300 (e.g., any one or more of the various semiconductor dies of chipsets 200/300, discussed above). Providing architecture 1000 with control over which of its semiconductor dies are in an ON-state and which are in an OFF-state allows, in accordance with one or more embodiments, for control over the gain and power levels of the output signal(s) of amplifier architecture 1000 and/or for improved power management. Furthermore, as will be appreciated in light of this disclosure, providing architecture 1000 with the ability to actively electronically turn ON/OFF any one or more of its constituent semiconductor dies may make it unnecessary, for example, to include a microwave switch at the input of the multi-channel power amplifier 1000, thereby improving speed and lowering loss of any given channel thereof.

To these ends, and in accordance with an embodiment, control circuit 400 may include one or more electronic switching circuits 420 configured to provide digital command signal(s) which can be used to electronically switch ON or OFF a given circuit die of architecture 1000. When the appropriate command signal is provided by a given switching circuit 420, a complementary metal-oxide-semiconductor (CMOS) switch within that switching circuit 420 switches between the ON-state voltage and OFF-state voltage for a given semiconductor die of architecture 1000. In one specific example embodiment, the aforementioned CMOS switch can be a low-impedance CMOS single-pole, double-throw (SPDT) switch. In another specific example embodiment, the CMOS switch may be configured as described in U.S. patent application Ser. No. 13/016,599, filed on Jan. 28, 2011, and titled "High Power Amplifier," which is herein incorporated by reference in its entirety. Other suitable configurations for a given electronic switching circuit 420 of control circuit 400 will depend on a given application and will be apparent in light of this disclosure.

Figure 5:
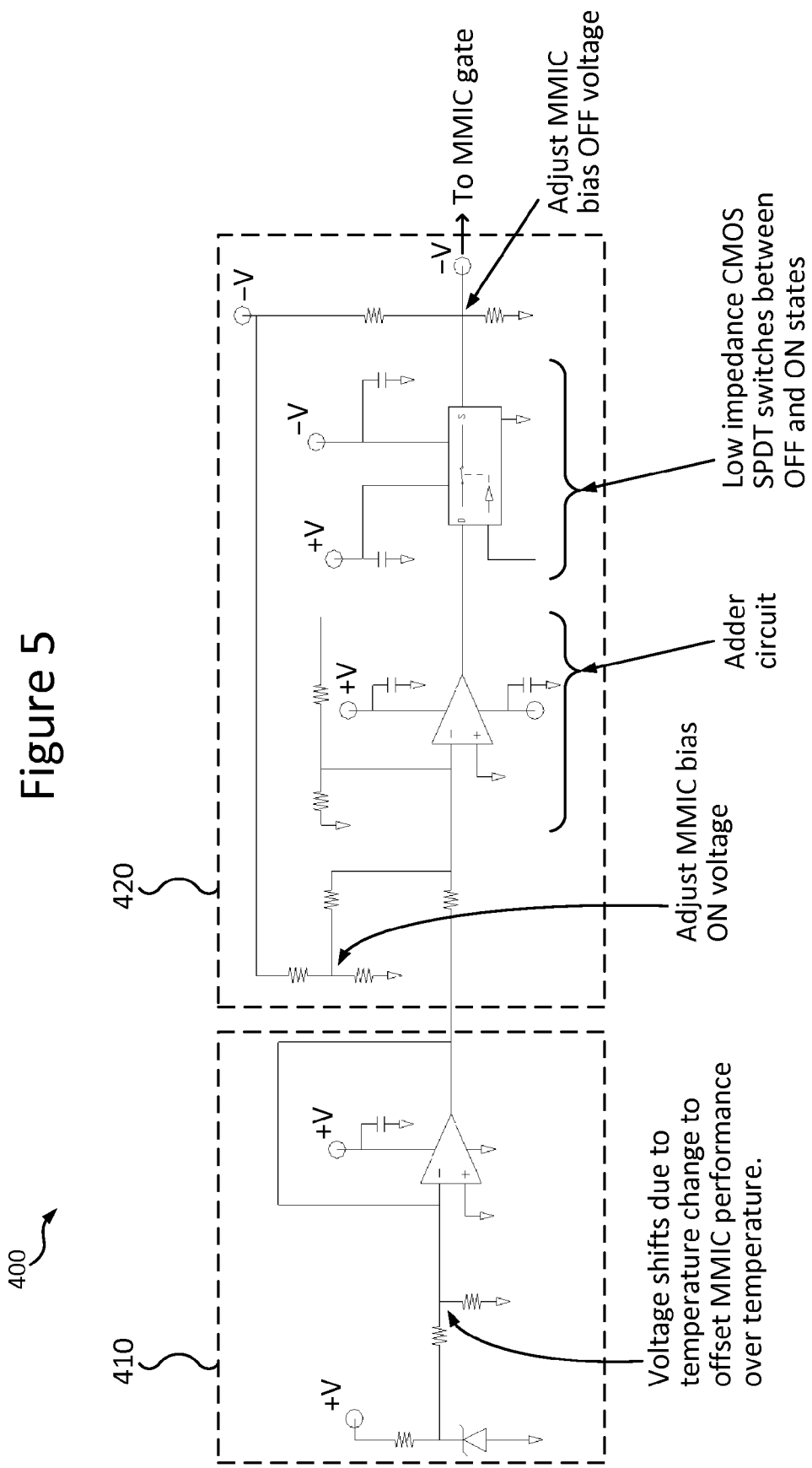
FIG. 5 is a circuit schematic of a control circuit configured in accordance with an embodiment of the present invention.

It should be noted that while the example control circuit 400 of FIG. 5 depicts only a single switching circuit 420, the claimed invention is not so limited. In other embodiments, multiple switching circuits 420 can be provided such that any of the circuit dies of architecture 1000 discussed above can be operatively coupled with its own switching circuit 420. Thus, control circuit 400 may include multiple instances of switching circuit 420, each of which is operatively coupled with a different semiconductor die of architecture 1000. In some instances, this may allow for control to be done on a per-channel basis, as discussed below.

In accordance with an embodiment, control circuit 400—by virtue of including one or more electronic switching circuits 420—may allow for disengaging a particular channel (e.g., providing one or more OFF channels) without interfering with the performance of the operating channel (the ON channel). For instance, using the gate bias control of the devices in a particular channel, control circuit 400 can shut down an entire channel chipset (e.g., channel chipset 200, 300, or other, if provided) of architecture 1000 as desired and thus effectively select from any of the various channels of architecture 1000. Providing control circuit 400 with this ability may be useful, for example, in cases in which only a single channel chipset is to be used for amplification of a given Input Signal (e.g., only one sub-band is to be amplified, and so only one channel chipset is to be enabled to provide that amplification).

Furthermore, in some instances, control circuit 400—by virtue of including one or more electronic switching circuits 420—may allow for complete control over the output power levels of architecture 1000 without need to use other components such as attenuators or variable gain amplifiers. It should be noted, however, that the claimed invention is not so limited, as components such as attenuators and variable gain amplifiers optionally may be included in other embodiments. Numerous configurations will be apparent in light of this disclosure.

When included, control circuit 400 may be located, for example, on the underside of architecture 1000 (e.g., such as on the underside of module 1002 of FIG. 2). In some such instances, it may be desirable to confine control circuit 400 to a region which avoids interfering (or otherwise negligibly interferes) with the performance of HPAs 230 and 330 of architecture 1000. For instance, in one example embodiment, control circuit 400 can be made to reside within the bounds of region β of module 1002 shown in FIG. 2, so as not to adversely affect any metal layer(s) included under HPAs 230 and 330, for example, for thermal management purposes. Other suitable locations for and approaches to integrating control circuit 400 with amplifier architecture 1000 and/or module 1002 will depend on a given application and will be apparent in light of this disclosure.

Example Implementation Data

Figure 6A:
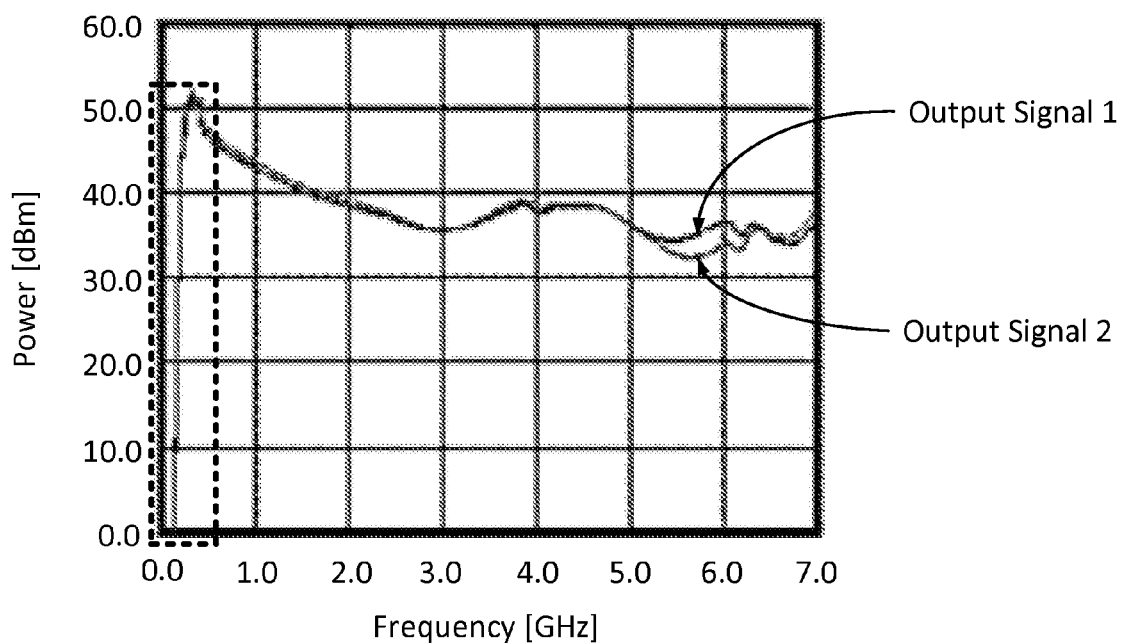
FIG. 6A illustrates experimental results for the output of an architecture utilizing an active divider in accordance with an embodiment of the present invention
Figure 6B:
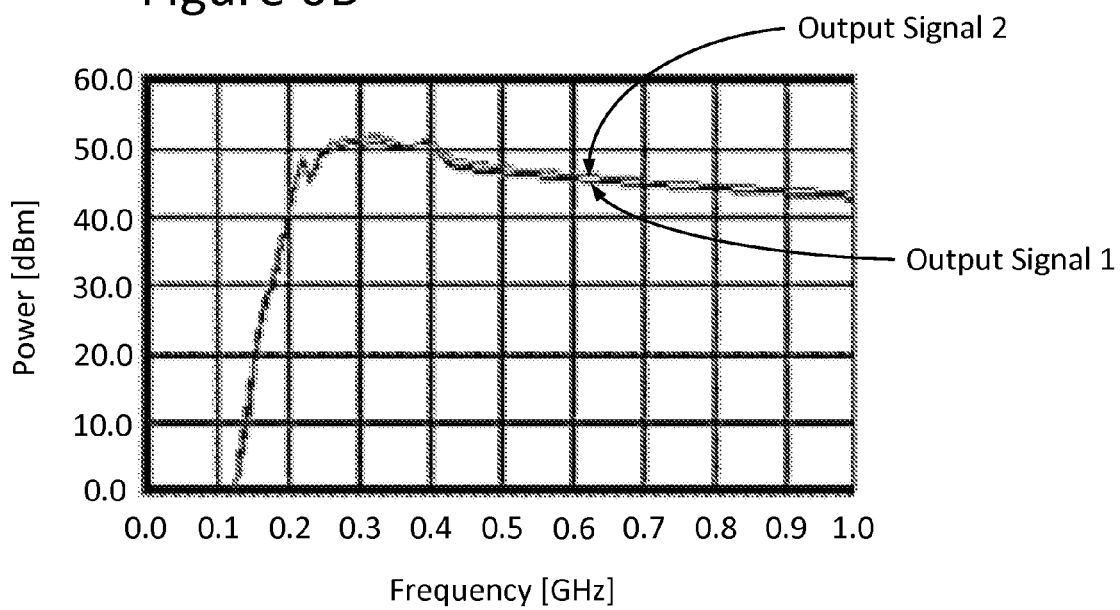
FIG. 6B is an adjusted-scale view of the portion of FIG. 6A enclosed by the dashed box contained therein.

FIG. 6A illustrates experimental results for the output of an architecture 1000 utilizing an active divider 100b in accordance with an embodiment of the present invention, and FIG. 6B is an adjusted-scale view of the portion of FIG. 6A enclosed by the dashed box contained therein. FIGS. 6A-6B demonstrate that architecture 1000 can be configured, in some embodiments, to provide ultra-wideband output signals (e.g., Output Signals 1 and 2) which exhibit very even power splitting, for instance, over an approximately 70:1 bandwidth (e.g., from 7 GHz down to nearly 0.1 GHz, as evident from FIG. 6B). As previously noted, amplifier architecture 1000 may provide similar amplification performance over lesser and/or greater bandwidths, as desired for a given target application or end-use.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An amplifier circuit comprising:
   a power divider configured to receive a radio frequency (RF) input signal;
   a first chipset operatively coupled with the power divider and configured to amplify a first sub-band of the input signal;
   a second chipset operatively coupled with the power divider and configured to amplify a second sub-band of the input signal; and
   a control circuit to control chipset output, the control circuit comprising a temperature sensing circuit configured to detect an ambient temperature change, generate a sense voltage therefrom, and shift a bias voltage supplied to at least one of the first chipset and/or the second chipset based on combination of the sense voltage and the bias voltage;
   wherein the input signal is of a given bandwidth, and sub-bands amplified by the amplifier circuit including the first sub-band and the second sub-band, in the aggregate, cover the bandwidth of the input signal.

2. The amplifier circuit of claim 1, wherein the power divider comprises a passive power divider which provides an approximately 50%/50% power split of the input signal to the first chipset and the second chipset.

3. The amplifier circuit of claim 1, wherein the power divider comprises a passive power divider which provides an approximately even power split of the input signal to each sub-band.

4. The amplifier circuit of claim 1, wherein the power divider comprises an active power divider configured to at least one of evenly split the input signal and/or provide gain to the input signal.

5. The amplifier circuit of claim 1 further comprising one or more additional chipsets, each coupled with the power divider and configured to amplify a different sub-band of the input signal, wherein the temperature sensing circuit is configured to shift the bias voltage supplied to the one or more additional chipsets based on the sense voltage.

6. The amplifier circuit of claim 1, wherein the bandwidth of the input signal is about 70:1 or lower.

7. The amplifier circuit of claim 1, wherein the bandwidth of the input signal is about 18:1 or lower.

8. The amplifier circuit of claim 1, wherein at least one of the first chipset and/or the second chipset includes a gallium-nitride (GaN)-based monolithic microwave integrated circuit (MMIC).

9. The amplifier circuit of claim 1, wherein the combination involves adding the sense voltage to the bias voltage.

10. The amplifier circuit of claim 9, wherein the sense voltage is positive and the bias voltage is negative, thereby producing a less negative bias voltage.

11. The amplifier circuit of claim 9, wherein the shift of the bias voltage is about 0.3 V.

12. The amplifier circuit of claim 1, wherein the control circuit further comprises a switching circuit which provides a command signal that is used to electronically switch ON or OFF at least a portion of the first chipset and/or the second chipset.

13. The amplifier circuit of claim 12, wherein the switching circuit includes a complementary metal-oxide-semiconductor (CMOS) single-pole, double-throw (SPDT) switch, and the command signal adjusts gate bias of at least a portion of the first chipset and/or the second chipset.

14. The amplifier circuit of claim 1 further comprising:
a first antenna operatively coupled with the first chipset; and
a second antenna operatively coupled with the second chipset.

15. An amplifier circuit comprising:
a power divider configured to receive a radio frequency (RF) input signal;
a first chipset operatively coupled with the power divider and configured to amplify a first sub-band of the input signal, the first chipset comprising:
a first pre-driver;
a first driver operatively coupled with the first pre-driver; and
a first high power amplifier operatively coupled with the first driver;
a second chipset operatively coupled with the power divider and configured to amplify a second sub-band of the input signal, the second chipset comprising:
a second pre-driver;
a second driver operatively coupled with the second pre-driver; and
a second high power amplifier operatively coupled with the second driver; and
a control circuit to control chipset output, the control circuit comprising a temperature sensing circuit configured to detect an ambient temperature change, generate a sense voltage therefrom, and add the sense voltage to a gate bias voltage supplied to at least one of the first pre-driver, the first driver, the first high power amplifier, the second pre-driver, the second driver, and/or the second high power amplifier;
wherein at least one of the first pre-driver, the first driver, the first high power amplifier, the second pre-driver, the second driver, and/or the second high power amplifier comprises a gallium-nitride (GaN)-based monolithic microwave integrated circuit (MMIC).

16. The amplifier circuit of claim 15 further comprising an off-chip matching circuit operatively coupled with the first high power amplifier of the first chipset.

17. The amplifier circuit of claim 15, wherein the first chipset and the second chipset serve to partition a full, instantaneous operating bandwidth of the input signal.

18. The amplifier circuit of claim 15, wherein the control circuit further comprises a switching circuit configured to provide a command signal which is used to electronically switch ON or OFF at least one of the first pre-driver, the first driver, the first high power amplifier, the second pre-driver, the second driver, and/or the second high power amplifier.

19. A transmitter comprising:
a passive, in-phase power divider configured to receive an input signal having a bandwidth of at least 18:1;
a first channel chipset operatively coupled with the passive power divider and configured to amplify a first sub-band of the input signal;
a second channel chipset operatively coupled with the passive power divider and configured to amplify a second sub-band of the input signal;
a first antenna operatively coupled with the first channel chipset and configured to transmit the first sub-band after amplification thereof by the first channel chipset;
a second antenna operatively coupled with the second channel chipset and configured to transmit the second sub-band after amplification thereof by the second channel chipset; and
a control circuit to control channel chipset output, the control circuit comprising a temperature sensing circuit configured to detect an ambient temperature change, generate a sense voltage therefrom, and shift a gate bias voltage supplied to at least one of the first channel chipset and/or the second channel chipset based on combination of the sense voltage and the gate bias voltage.

20. The transmitter of claim 19, wherein the control circuit further comprises a switching circuit configured to provide a command signal which is used to electronically switch ON or OFF at least a portion of the first channel chipset and/or the second channel chipset.

21. The transmitter of claim 19, wherein the control circuit is configured to reduce output power and gain levels of at least one of the first channel chipset and/or the second channel chipset and to maintain frequency bandwidth response at those reduced output power and gain levels.

* * * * *